United States Patent
Tada et al.

(10) Patent No.: US 9,059,402 B2
(45) Date of Patent: *Jun. 16, 2015

(54) RESISTANCE-VARIABLE ELEMENT AND METHOD FOR MANUFACTURING THE SAME

(75) Inventors: Munehiro Tada, Tokyo (JP); Toshitsugu Sakamoto, Tokyo (JP); Yuko Yabe, Tokyo (JP); Yukishige Saito, Tokyo (JP); Hiromitsu Hada, Tokyo (JP)

(73) Assignee: NEC CORPORATION, Tokyo (JP)

( * ) Notice: Subject to any disclaimer, the term of this patent is extended or adjusted under 35 U.S.C. 154(b) by 130 days.

This patent is subject to a terminal disclaimer.

(21) Appl. No.: 13/380,092

(22) PCT Filed: Jun. 21, 2010

(86) PCT No.: PCT/JP2010/060430
§ 371 (c)(1),
(2), (4) Date: Dec. 22, 2011

(87) PCT Pub. No.: WO2010/150723
PCT Pub. Date: Dec. 29, 2010

(65) Prior Publication Data
US 2012/0091426 A1    Apr. 19, 2012

(30) Foreign Application Priority Data
Jun. 25, 2009    (JP) ................ 2009-150778

(51) Int. Cl.
*H01L 45/00* (2006.01)
*G11C 13/00* (2006.01)

(52) U.S. Cl.
CPC ........ *H01L 45/1233* (2013.01); *G11C 13/0011* (2013.01); *G11C 2213/15* (2013.01);

(Continued)

(58) Field of Classification Search
CPC .............. H01L 45/146; H01L 45/1616; H01L 45/1608; H01L 45/1233
USPC .................. 257/2–4, E45.002–E45.003, 43, 257/E29.068; 438/104, 85
See application file for complete search history.

(56) References Cited

U.S. PATENT DOCUMENTS

2007/0285148 A1* 12/2007 Sakamoto et al. ............ 327/365
2008/0048164 A1*  2/2008 Odagawa ......................... 257/2

(Continued)

FOREIGN PATENT DOCUMENTS

JP    2008-244090    10/2008
JP    2009-043757     2/2009

(Continued)

OTHER PUBLICATIONS

Michaelis, A. (2008) Valve Metal, Si and Ceramic Oxides as Dielectric Films for Passive and Active Electronic Devices, in Electrochemical Surface Modification: Thin Films, Functionalization and Characterization (eds R. C. Alkire, D. M. Kolb, J. Lipkowski and P. N. Ross), Wiley-VCH Verlag GmbH & Co. KGaA, Weinheim, Germany. doi: 10.1002/97835276253.*

(Continued)

*Primary Examiner* — Zandra Smith
*Assistant Examiner* — Lauren R Bell
(74) *Attorney, Agent, or Firm* — Young & Thompson

(57) ABSTRACT

A resistance-variable element as disclosed has high reliability, high densification, and good insulating properties. The device provides a resistance-variable element in which a first electrode including a metal primarily containing copper, an oxide film of valve-metal, an ion-conductive layer containing oxygen and a second electrode are laminated in this order.

6 Claims, 10 Drawing Sheets

(52) U.S. Cl.
CPC ........ *G11C2213/32* (2013.01); *G11C 2213/56* (2013.01); *H01L 45/146* (2013.01); *H01L 45/1616* (2013.01)

(56) References Cited

U.S. PATENT DOCUMENTS

| | | | |
|---|---|---|---|
| 2009/0135370 A1 | 5/2009 | Xiao | |
| 2009/0272959 A1* | 11/2009 | Phatak et al. | 257/2 |
| 2009/0272961 A1* | 11/2009 | Miller et al. | 257/4 |
| 2010/0133501 A1* | 6/2010 | Sakamoto et al. | 257/4 |
| 2010/0167502 A1* | 7/2010 | Yen et al. | 438/478 |

FOREIGN PATENT DOCUMENTS

| | | |
|---|---|---|
| JP | 2009-135370 | 6/2009 |
| WO | 2007/114099 | 10/2007 |
| WO | WO 2007114099 A1 * | 10/2007 |
| WO | 2008/001712 | 1/2008 |
| WO | 2010/073897 | 7/2010 |
| WO | 2010/079816 | 7/2010 |

OTHER PUBLICATIONS

Howard, S.M.. "Ellingham Diagrams." (2006) Web. Jun. 10, 2014. <http://showard.sdsmt.edu/MET320/Handouts/EllinghamDiagrams/Ellingham_v22_Macro.pdf>.*

International Search Report—PCT/JP2010/060430—Sep. 21, 2010.

Shunichi Kaeriyama et al., "A Nonvolatile Programmable Solid-Electrolyte Nanometer Switch", IEEE Journal of Solid-State Circuits, vol. 40, No. 1, pp. 168-176, Jan. 2005.

Office Action dated Jul. 9, 2013 issued by the Japanese Patent Office in counterpart Japanese Patent Application No. 2011-519874 with partial English translation, 4 pages.

* cited by examiner

Fig. 2
(a)
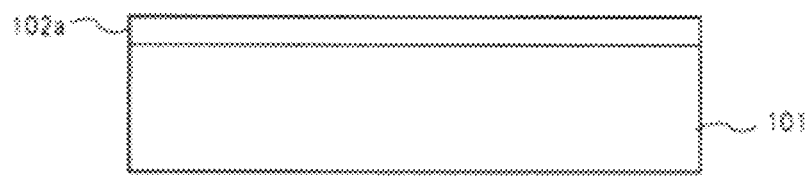
(b)
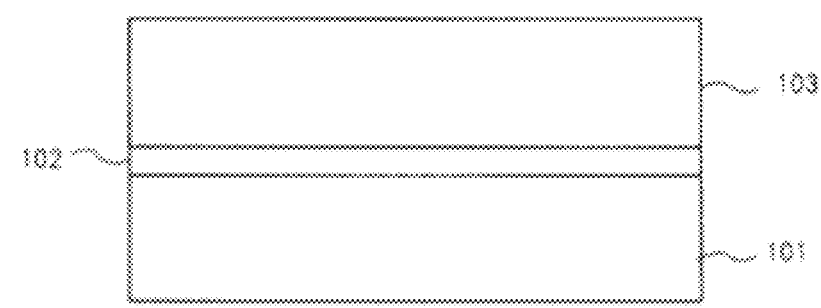
(c)
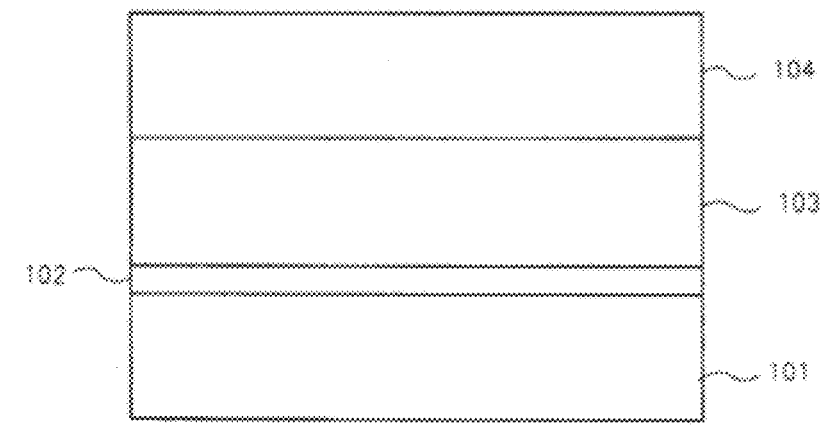

Fig. 4
(A)
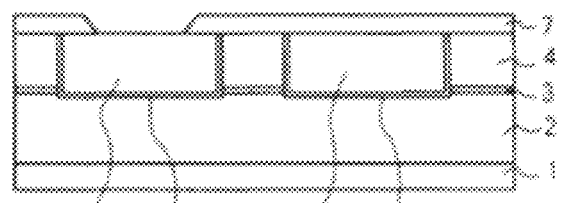
(B)
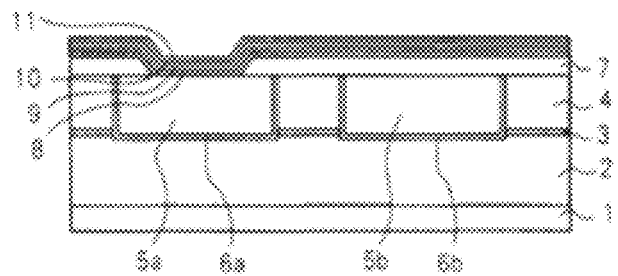
(C)
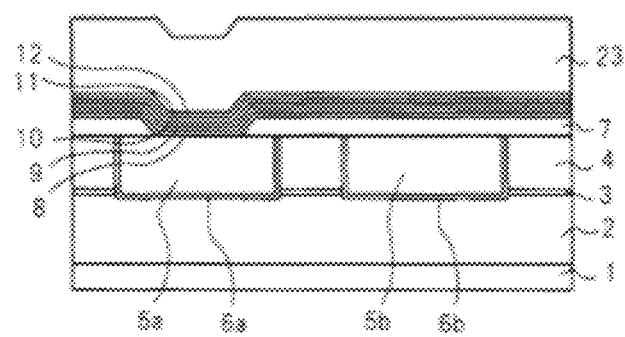

Fig. 6
(A)
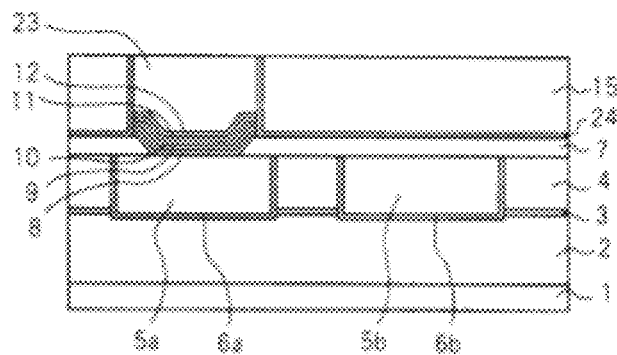
(B)
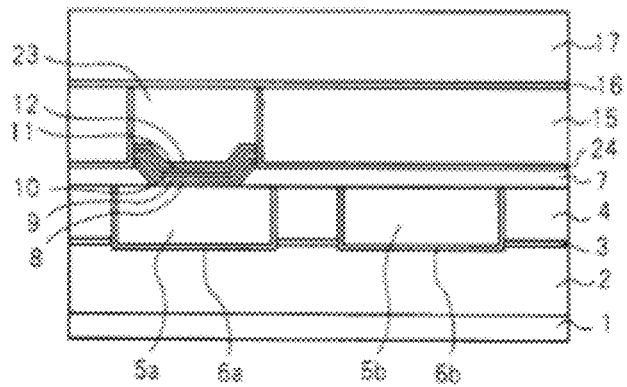

Fig. 7
(A)
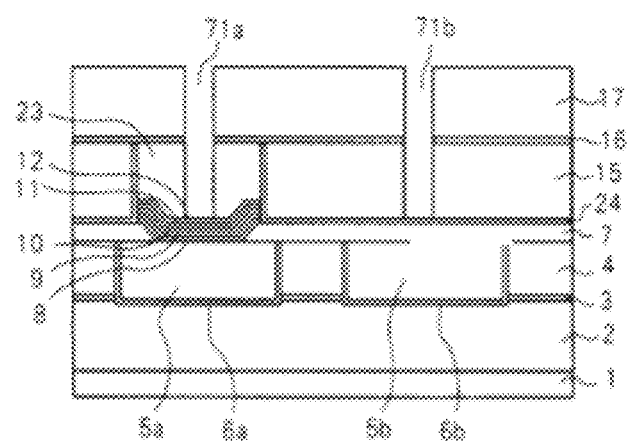
(B)
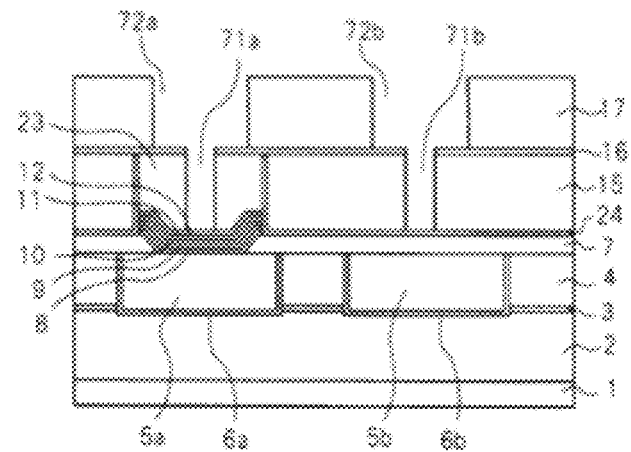

RESISTANCE-VARIABLE ELEMENT AND METHOD FOR MANUFACTURING THE SAME

FIELD OF THE INVENTION

The present invention relates to a semiconductor device and a method for manufacturing the same, and more particularly, the present invention relates to a semiconductor device provided with a field programmable gate array (FPGA) having a resistance-variable non-volatile element (hereinafter, it is referred to as "resistance-variable element) within multiple wiring layers, a resistance-variable element, and a method for manufacturing the same.

DESCRIPTION OF THE RELATED ART

For semiconductor devices such as silicon devices, studies for integration and low power consumption have been progressed at the pace of 4 folds for three years based Scaling Law (Moore' Law). Recently, the length of gate in MOSFET (Metal Oxide Semiconductor Field Effect Transistor) became 20 nm or less, and costs of devices or mask sets used in lithography processes increased. Further, due to physical limitations in device dimensions (for example, limitations relating to working or unevenness), there is a need for an approach to improve device performances other than the current Scaling Law.

Recently, a re-recordable type programmable logic device which is laid in the middle position between the gate array and the standard cell, so-called FPGA (Field Programmable Gate Array) has been developed. The FPGA allows a user to construct arbitrarily a desired circuit after manufacturing a chip. The FPGA has a resistance-variable element within multiple wiring layers, and a user can electrically connect the wiring as necessary. By using a semi-conductor device provided with such FPGA, the degree of freedom for a circuit may be improved. As the resistance-variable element, ReRAM (Resistance Random Access Memory) using a transition metal oxide or NanoBridge (trade mark registered by NEC Corporation) using an ion conductor may be used.

As a resistance-variable element having a high probability of enhancing the degree of freedom of a circuit, a switching element which uses the migration of metal ions and electrochemical reactions between ions within an ion conductor is disclosed in non-Patent Document 1. The switching element disclosed in non-Patent Document 1 has a three-layer structure comprising an ion conductive layer, a first electrode and a second electrode, wherein the ion conductive layer is placed between the first and second electrodes, and the first and second electrodes are displaced opposed to each other. The first electrode acts to supply metal ions to the ion conductive layer, but the second electrode dose not supply metal ions.

Said switching element is operated as described below. Briefly, when the first electrode is grounded and a negative voltage is applied to the second electrode, the first electrode metal is dissolved in the ion conductive layer and metal ions are discharged from the metal. Then, the metal ions are precipitated as a metal in the ion-conductive layer, and the precipitated metal forms a metal bridge between the first and second electrodes. Thus, the first electrode is connected electrically to the second electrode by the metal bridge, and a switch is switched to "ON". In the ON-state, if the first ground is grounded and a positive voltage is applied to the second electrode, a part of the metal bridge is broken. Consequently, the first electrode is electrically disconnected from the second electrode, and the switch is switched to "OFF". Electrical properties are varied, for example resistance between the first and second electrodes is increased, or inter-electrode capacity is varied, until complete disconnection is ultimately obtained. Further, if the first electrode is grounded again, and a negative voltage is applied to the second electrode, "OFF" may be switched to "ON".

Further, a 2-terminal type switching element and the configuration and the working behavior thereof is disclosed in non-Patent Document 1, wherein two electrodes are disposed with an ion conductor interposed, and a conduction state therebetween is controlled.

Such switching elements are characterized by having smaller size than semiconductor type switches such as MOSFET which are usually used in the art. Therefore, it is considered that such switching elements may be effectively used in programmable logic devices. Further, since the conduction state (ON or OFF) of such switching elements is still maintained when an applied voltage is OFF, it is considered that they may be used as a non-volatile memory element. For example, a memory cell comprising one selective element such as transistor and one switching element is used as a base unit, and a plurality of memory cells are disposed in the longitudinal and transversal directions. By using such an arrangement, any memory cell can be selected among multiple memory cells in word lines and bit lines. Further, the conduction state of the selected memory cell may be detected, and the stored information, i.e. either one of '1' or '0' information may be read from the ON/OFF state of switching element.

PRIOR ART DOCUMENT

Non-Patent Document

Non-Patent Document 1: Shunichi Kaeriyama et al., "A Nonvolatile Programmable Solid-Electrolyte Nanometer Switch", IEEE Journal of Solid-State Circuits, Vol. 40, No. 1, pp. 168-176, January 2005.

SUMMARY OF THE INVENTION

Problems to be Solved by the Invention

Recently, as high integration is requested, there are needs for the miniaturization and hence the high densification of a resistance-variable element, as well as the reduction of the number of processes. Also, there are needs for improvement of the performance (low resistance) and the reliability of a resistance-variable element. Therefore, a resistance-variable element having high integration, high performance and high reliability and a method for manufacturing the same are requested.

The objective of the present invention is to provide a resistance-variable element having high reliability, high densification and good insulating property.

Means for Solving the Problems

The present invention is a resistance-variable element in which a first electrode comprising copper, an oxide film of valve-metal, an ion-conductive layer containing oxygen and a second electrode are laminated in this order.

Preferably, the ion-conductive layer is an oxide primarily containing at least one of Ta, Zr or Hf.

Preferably, the ion-conductive layer is a composite oxide of at least one of Ta, Zr or Hf and Si.

Preferably, the oxide film of valve-metal is titanium oxide, and the film thickness may be 4 nm or less.

Preferably, the second electrode comprises Ru, Ni or Pt.

Preferably, a method for manufacturing the above-mentioned resistance-variable element, comprising the steps of: forming a valve-metal film on the first electrode, and oxidizing the valve-metal film while forming the ion-conductive layer under the presence of oxygen.

Preferably, the ion-conductive layer is formed by a sputtering or ALD method.

Preferably, the valve-metal film is a titanium film, and the thickness of the titanium film may be 2 nm or less.

Effect of the Invention

Further, since the resistance-variable element has fast electric field diffusion of copper in a titanium oxide layer under low resistance (i.e., ON-state), a bridge formed by copper ions is divided into pieces within the titanium oxide layer. Thus, the remaining bridge in an ion-conductive layer may be broken by the titanium oxide layer, thereby facilitating voltage application. It may promote the recovery of copper ions at OFF-state, resulting in improving the switching property of the resistance-variable element.

Further, according to the method for manufacturing the resistance-variable element of the present invention, the oxidation of copper may be prevented when forming the ion-conductive layer. More particularly, the oxidation of copper may be prevented by the oxidation of a valve-metal film formed on copper when forming the ion-conductive layer.

BRIEF DESCRIPTION OF THE DRAWINGS

FIG. 2 is a cross-section view showing processes involved in a method for manufacturing the resistance-variable element of the present invention.

FIG. 4 is a cross-section view showing processes involved in a method for manufacturing the semiconductor device according to Embodiment 3.

FIG. 6 is a cross-section view showing processes involved in a method for manufacturing the semiconductor device according to Embodiment 3.

FIG. 7 is a cross-section view showing processes involved in a method for manufacturing the semiconductor device according to Embodiment 3.

DETAILED DESCRIPTION OF THE PREFERRED EMBODIMENTS

This invention relates to a resistance-variable element in which a first electrode comprising copper, an oxide film of valve-metal, an ion-conductive layer containing oxygen and a second electrode are laminated in this order.

The low resistance-variable element according to this invention allows to break a bridge formed by copper ions within the ion-conductive layer by an oxide film of valve-metal, in particular titanium oxide film or aluminum oxide film under low resistance (i.e., ON-state), thereby promoting the recovery of metal ions such as copper ions at OFF-state. More particularly, first, in a state where copper ions form a bridge in the ion-conductive layer (i.e., ON-state), if "ON" is switched to "OFF", copper ions in a valve-metal oxide (such as titanium oxide) having fast copper electric field diffusion are recovered on the copper electrode. Then, a voltage is applied to the valve-metal oxide (insulator). Since the valve-metal oxide has fast copper electric field diffusion, copper ions in the ion-conductive layer may be rapidly recovered. As a result, the switching property of resistance-variable element may be enhanced. Said principle is a hypothesis, but this invention is not limited to this principle.

Further, according to the method for manufacturing the resistance-variable element of this invention, the oxidation of copper may be prevented when forming the ion-conductive layer. More particularly, the oxidation of copper may be prevented by the oxidation of a valve-metal film formed on copper when forming the ion-conductive layer. That is, since titanium or aluminum has greater negative value than copper in the standard free energy of oxide, the valve-metal film formed on copper acts to absorb oxygen generated during forming the ion-conductive layer, and also the valve-metal become an oxide film of valve-metal having the nature capable of conducting ions (Embodiment 1)

First, a semiconductor device according to an embodiment of this invention will be described with reference to the drawings.

Figure 1:
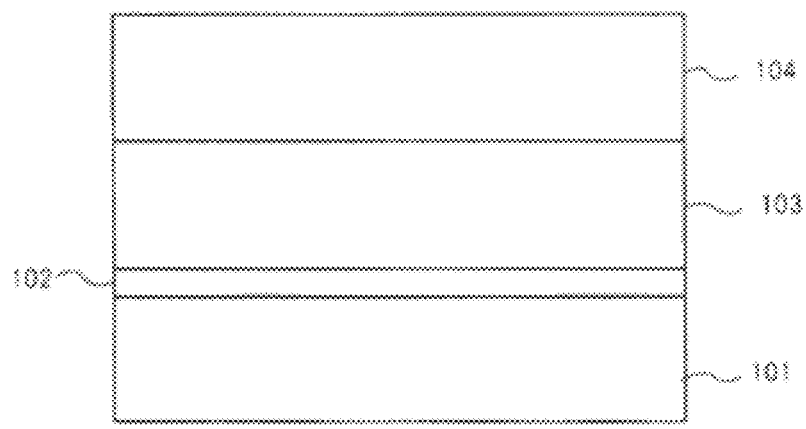
FIG. 1 is a partial cross-section view showing the configuration of the semiconductor device according to an embodiment of the present invention.

FIG. 1 is a partial cross-section view showing the configuration of the semiconductor device according to an embodiment of this invention.

In FIG. 1, titanium oxide film (or aluminum oxide film) 102 is formed on first electrode 101 comprising a metal primarily containing Cu. Ion-conductive layer 103 containing oxygen is formed on titanium oxide film 102. Second electrode 104 is formed on ion-conductive layer 103.

<First Electrode>

The first electrode in the present invention comprises copper. The first electrode functions to supply copper ions to the ion-conductive layer.

As the impurities in copper, Al, Sn, Ti, or the like may be contained.

<Valve-Metal Oxide Film>

The oxide film of a valve-metal such as titanium or aluminum (titanium oxide or aluminum oxide film) is formed in contact with the first electrode. The valve-metal is metal which tends to form a passive body (a passive state).

Because valve-metal has greater negative value than copper in the standard free energy of oxide, valve-metal absorbs oxygen generated during forming the ion-conductive layer to suppress the oxidation of copper.

Also, the copper wiring is generally formed by an electric field plating method, in this case, a few amount of oxygen may be contained in a copper film due to impurities present in a plating solution. The remaining oxygen in copper may increase the unevenness of a bridge generated upon switching. The valve metal functions to absorb oxygen derived from a bottom copper wiring during a process.

The preferable film thickness is 4 nm or less.

By forming the oxide film of valve-metal such as titanium oxide or aluminum oxide film between the first electrode and the ion-conductive layer, when switching to high resistance (OFF-state), a bridge formed by copper ions through the ion conductive layer and the oxide film of valve-metal (titanium oxide or aluminum oxide) under low resistance (ON-state) is broken by the oxide film of valve-metal, in particular titanium oxide or aluminum oxide film, this resulting the bridge or copper within the oxide film of valve-metal is preferentially recovered. Thus, an electric field is applied within the oxide film of valve-metal, and copper ions within the ion-conductive layer may be easily recovered. Therefore, the switching property of the resistance-variable element may be improved.

A method for forming a titanium oxide film (or aluminum oxide film) is not particularly limited, and such film may be formed, for example, by the procedure as described below. First, a titanium film (or aluminum film) is formed on the first electrode. Then, the ion-conductive layer is formed by a sputtering method. By introducing oxygen during a sputtering process, the titanium film (or aluminum film) is oxidized to the titanium oxide film (or aluminum oxide film).

The thickness of the titanium oxide film is preferably within the range of 1 nm to 3 nm Since the formation and recovery of a metal bridge in the ion-conductive layer follows an electric field control manner, a voltage needed for switching operation may be controlled at a low value by forming the titanium oxide film having the film thickness of 3 nm or less.

<Ion Conductive Layer>

The ion-conductive layer in the present invention, contains oxygen. The ion-conductive layer also is preferably an oxide primarily containing at least one of Ta, Zr and Hf.

The ion-conductive layer is preferably a composite oxide of "Ta, Zr or Hf" and "Si".

The present invention relates to a resistance-variable element which utilizes the migration of metal ions and electrochemical reactions within an ion conductor (a solid in which ions is free to move such as by applying an electric field). The first electrode functions to supply copper ions to the ion-conductive layer. The resistance-variable element controls "ON/OFF" by applying a voltage or supplying a current, and also by utilizing the electric field diffusion of copper from the first electrode into the ion-conductive layer.

<Second Electrode>

The second electrode is not particularly limited, but preferably comprises Ru, Ni or Pt.

(Embodiment 2)

An embodiment illustrating a method for manufacturing the resistance-variable element will be described in detail with reference to FIG. 2. However, this invention is not limited to this Embodiment.

In the following, a method for manufacturing the resistance-variable element according to this invention will be exemplified with reference to FIG. 2. First, titanium film $102a$ is formed on first electrode 1 comprising a metal primarily containing Cu (FIG. $2(a)$). Next, titanium film $102a$ is oxidized to titanium oxide film 102 while forming ion-conductive layer 103 on titanium film $102a$ (FIG. $2(b)$). Next, second electrode 104 is formed on ion-conductive layer 103 (FIG. $2(c)$).

The resistance-variable element manufactured by this embodiment has titanium oxide film 102 and ion-conductive layer 103 interposed between upper electrode 104 and lower electrode 101. Also, the resistance-variable element has a laminated structure in which lower electrode 101, titanium oxide film 102, ion-conductive layer 103 and upper electrode 104 are laminated in this order. Also, lower electrode 101 is a metal film comprising Cu, and ion-conductive layer 103 is an oxygen-containing film.

Lower electrode 101 comprises Cu, but it may be formed by a sputtering or electric field plating method. Also, as impurities in copper, Al, Sn, Ti, or the like may be contained.

First, titanium film $102a$ is formed on lower electrode 101 (FIG. $2(a)$). Titanium film $102a$ may be formed by a method such as DC (direct current) sputtering. For example, when forming a titanium film on an 8-inch silicon wafer, the film-forming rate of 22 nm/min may be achieved under the condition of chamber pressure: 0.35 Pa, Ar flow rate: 40 sccm, substrate temperature: room temperature and sputtering power: 0.2 kW. A desired thickness of the resulting titanium film is 2 nm or less.

Then, ion-conductive layer 103 is formed on titanium film $102a$. Ion-conductive layer 103 is a layer containing oxygen, and an oxide primarily containing Ta, Zr or Hf may be used as the ion-conductive layer.

As an oxide primarily containing Ta, for example, $Ta_{0.8}Si_{0.2}O_x$ may be used. X is preferably within the range of 2~2.5. If X is 2 or more, the generation of defects due to oxygen and the increase of leakage current in the ion-conductive layer may easily be suppressed. The leakage current is current leaked in OFF-state. Therefore, the leakage current is leaked from a switching element, resulting in increasing operation power.

$Ta_{0.8}Si_{0.2}O_x$ may be formed by a sputtering method such as RF sputtering. By RF sputtering, for example, tantalum oxide containing 20% Si ($Ta_{0.8}Si_{0.2}O_x$) may be used as a target, and the film may be deposited under the condition of RF power 1~3 kW, $Ar/O_2$ mixed gas, room temperature and 1.3 Pa. The use of said mixed gas containing oxygen allows the oxidation of the titanium film to titanium oxide film 102. In addition to RF sputtering, DC sputtering using a metal target primarily containing tantalum and gas containing oxygen may also be used. Alternatively, a ALD method other than sputtering may be used.

Specifically, the condition of $Ar/O_2$=80/10 sccm, pressure 1.3 Pa, and RF power 3 kW may be used. Under this condition, when observing the thickness of titanium oxide film relative to the thickness of metallic Ti film by TEM cross-section observation, it has been found that the film thickness was varied as follows: Ti 1 nm→titanium oxide 2 nm, Ti 2 nm→titanium oxide 3.1 nm, Ti 3 nm→titanium oxide 4.2 nm. Also, when the thickness of titanium oxide film is 2 nm or 3.1 nm, the switching property having ON/OFF resistance ratio of 6 figures or more was confirmed. To the contrary, when the thickness of titanium oxide film is 4.2 nm, the switching property having ON/OFF resistance ratio of 2-3 figures was confirmed, and yield was also lowered. From this result, the thickness of titanium oxide film 102 is preferably 4 nm or less.

The total film thickness of titanium oxide film 102 and ion-conductive layer 103 is preferably 20 nm or less.

When $Ta_{0.8}Si_{0.2}O_x$ film is formed directly on copper having no titanium film deposited by any of said methods, copper is oxidized, resulting in deteriorating function as a lower electrode.

Further, depending on the specification of device, in the case that oxidizing power by oxygen plasma is strong, $Ar/O_2$ mixed gas may be changed to pure Ar gas, or alternatively the oxidation state of metallic Ti may be properly controlled by lowering the temperature of a substrate below room temperature.

Further, in order to maintain the high film-forming rate for the ion-conductive layer, the condition used in forming the film may be changed to 2 steps condition. In this case, the deposition is performed using pure Ar gas in a first step, and then the deposition is performed using Ar/O$_2$ mixed gas in a second step. Since Ar/O$_2$ mixed gas exhibits fast film-forming rate, the throughput may be effectively improved.

Next, upper electrode 4 may be deposited by DC sputtering using Ru as a target under the condition of DC power 0.2 kW, Ar gas flow 40 sccm, 0.27 Pa and room temperature. To inhibit oxygen desorption from ion-conductive layer 103 during forming the upper electrode, the deposition is preferably performed at room temperature.

Alternatively, in that case Ni is used as the upper electrode, for example, it may be deposited by DC sputtering using Ni as a target under the condition of DC power 0.2 kW, Ar gas flow 80 sccm, 0.53 Pa and room temperature.

The resistance-variable element thus formed is a resistance-variable non-volatile element, and may be used as a switching element utilizing the migration of copper ions and electrochemical reactions between ions within an ion conductor. Resistance-variable element controls ON/OFF by applying a voltage or supplying a current, for example utilizing the electric field diffusion of copper into titanium oxide film 103 and ion-conductive layer 103. Moreover, the resistance-variable element according to this invention may also be used as a memory element using both of non-volatile and resistance-variable properties, as well as a switching element.

As a substrate (not shown) on which the resistance-variable element is mounted, substrates such as silicon substrates, single crystal substrates, SOI (Silicon on Insulator) substrates, TFT (Thin Film Transistor) substrates, or substrates for liquid displays may be used, and also a semiconductor element may be formed on such substrates.

According to this embodiment, the ion-conductive layer may be formed while inhibiting the oxidation of copper as the lower electrode, thereby obtaining the resistance-variable element having high switching property.

Further, when forming the titanium oxide film, by depositing metallic Ti on the copper wiring and then forming the ion-conductive layer by RF sputtering, the metallic Ti is oxidized during forming the ion-conductive layer, thereby performing the formation of titanium oxide and ion-conductive layer in a self-registering manner.

(Embodiment 3)

Hereinafter, the semiconductor device according to this embodiment will be described with reference to the drawings. However, this invention is not limited to the following Embodiment.

Figure 3:
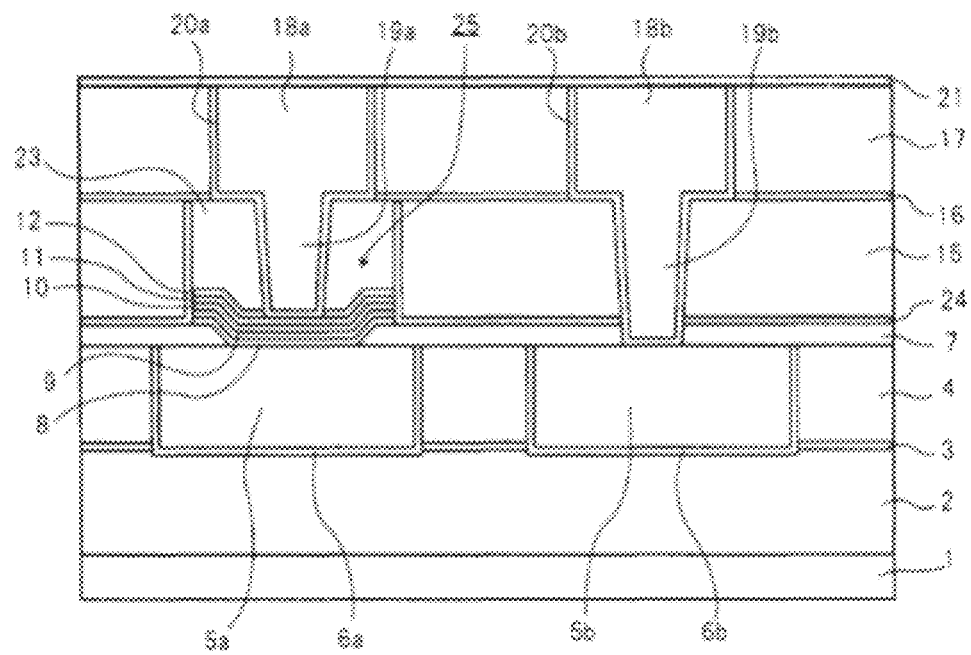
FIG. 3 is a schematic cross-section view showing the configuration of the semiconductor device according to Embodiment 3.
Figure 5:
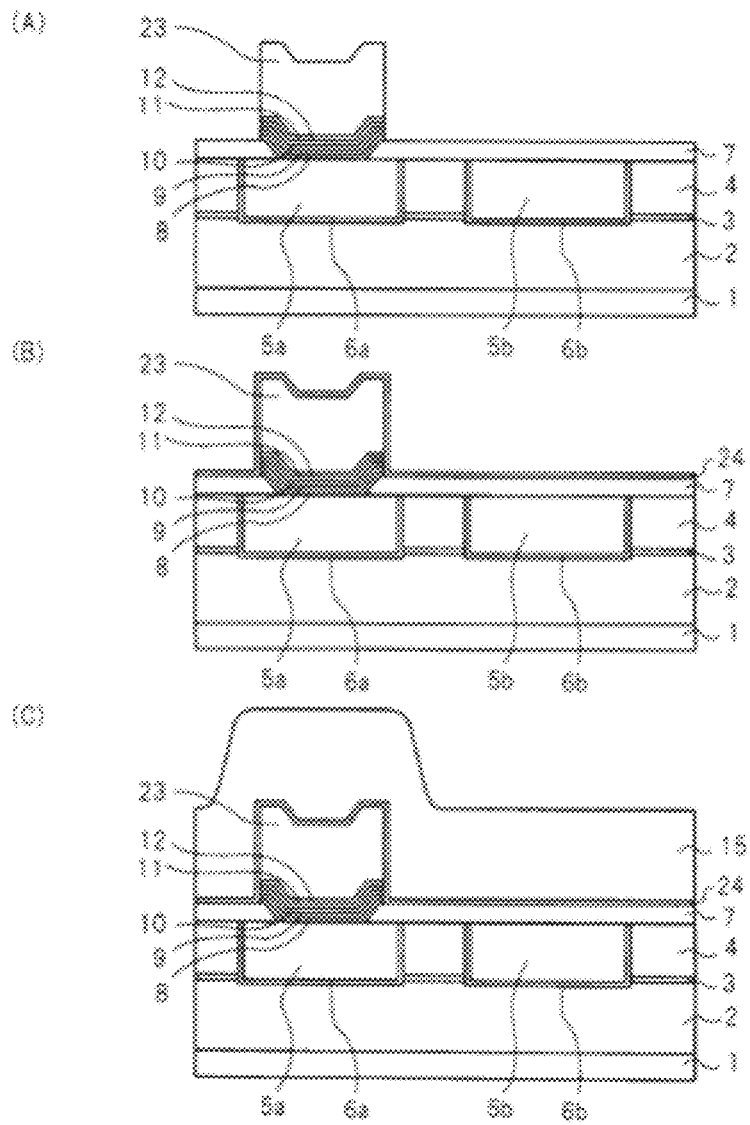
FIG. 5 is a cross-section view showing processes involved in a method for manufacturing the semiconductor device according to Embodiment 3.

FIG. 3 is a partial cross-section view showing the configuration of the semiconductor device according to this embodiment.

A device in which the resistance-variable element is formed within a multilayer wiring of a semiconductor device is exemplified in this embodiment.

In this embodiment, the resistance-variable element comprises first wiring 5a functioning as the lower electrode, titanium oxide film 8, ion-conductive layer 9, first upper electrode 10 and second upper electrode 11.

In the semiconductor device according to this embodiment, thick hard mask film 23 is formed on the laminated body of first upper electrode 10, second upper electrode 11 and hard mask film 12. The side surfaces of titanium oxide film 8, ion-conductive layer 9, first upper electrode 10, second upper electrode 11, hard mask film 12 and hard mask film 23 are covered with protective insulating film 24. Protective insulating film 24 is not formed on hard mask film 23, but is formed on insulating bather film 7. Further, according to this Embodiment, the portions (5b, 18b, 19b) of the wirings are not connected electrically to resistance-variable element 25. Plug 19b of second wiring 18b is connected electrically to first wiring 5b with barrier metal 20b interposed. The configuration of resistance-variable element part is the same as in Embodiment 1.

First wiring 5a is a wiring embedded into the wiring groove formed on interlayer insulating film 4 and barrier insulating film 3 with barrier metal 6a interposed. First wiring 5a also serves as the lower electrode of resistance-variable element 25, and is directly contacted with titanium oxide film 8. In addition, any electrode layer may be interposed between first wiring 5a and titanium oxide film 8. When forming such electrode layer, preferably the electrode layer, titanium oxide film 8 and ion-conductive layer 9 may be sequentially formed. As first wiring 5a, metals capable of diffusing and conducting ions into the ion-conductive layer, for example Cu may be used. The surface of first wiring 5a may be covered with CuSi.

First wiring 5b is a wiring embedded into the wiring groove formed on interlayer insulating film 4 and barrier insulating film 3 with barrier metal 6b interposed. First wiring 5b is not connected to resistance-variable element 25, but is connected electrically to plug 19b with barrier metal 20b interposed. For first wiring 5b, the same material as first wiring 5a, for example Cu may be used.

Barrier metals 6a and 6b are conductive films having barrier property, and cover over the side or bottom surfaces of the wirings to prevent a metal involved in first wiring 5 from being diffused into interlayer insulating film 4 or a lower layer. When first wirings 5a and 5b comprise metal elements primarily containing Cu, for example, high melting point metals or nitrides thereof such as tantalum (Ta), tantalum nitride (TaN), titanium nitride (TiN) and tungsten carbo-nitride (WCN), or laminated films thereof may be used as barrier metals 6a and 6b.

Second wiring 18a is a wiring embedded into the wiring groove formed on interlayer insulating film 17 and etching stopper film 16 with barrier metal 20a interposed. Second wiring 18a is formed integrally with plug 19a. Plug 19a is embedded into a pre-formed hole formed in hard mask film 23 and hard mask film 24 with barrier metal 20a interposed. Plug 19a is connected electrically to second upper electrode 11 with barrier metal 20a interposed.

Second wiring 18b is a wiring embedded into the wiring groove formed on interlayer insulating film 17 and etching stopper film 16 with bather metal 20b interposed. Second wiring 18b is formed integrally with plug 19b. Plug 19b is embedded into a pre-formed hole formed inn interlayer insulating film 15, protective insulating film 24 and insulating barrier film 7 with barrier metal 20b interposed. Plug 19b is connected electrically to first wiring 5b with barrier metal 20b interposed. For second wiring 18b and plug 19b, the same materials as second wiring 18a and plug 19a, for example Cu may be used.

Barrier metals 20a and 20b are conductive films having barrier property, and cover over the side or bottom surfaces of second wirings 18a, 18b and plugs 19a, 19b to prevent metals involved in second wirings 18a and 18b (including plugs 19a and 19b) from being diffused into interlayer insulating films 15 and 17 or a lower layer. When second wirings 18a, 18b and plugs 19a, 19b comprise metal elements primarily containing Cu, for example, high melting point metals or nitrides thereof such as tantalum (Ta), tantalum nitride (TaN), titanium nitride (TiN) and tungsten carbo-nitride (WCN), or laminated films thereof may be used as barrier metals 20a and 20b. Preferably, barrier metals 20a and 20b may be the same material as second upper electrode 11. For example, when barrier metals 20a and 20b have a laminated structure of TaN (lower layer)/

Ta (upper layer), the lower layer material TaN may preferably be used for second upper electrode 11. Alternatively, when barrier metals 20a and 20b are Ti (lower layer)/Ru (upper layer), the lower layer material Ti may preferably be used for second upper electrode 11.

Hard mask film 23 functions as a hard mask when etching hard mask film 12. Hard mask film 23 is preferably the type different from hard mask film 12. For example, hard mask film 12 is a SiN film, and hard mask film 23 may be a $SiO_2$ film.

Protective insulating film 24 is an insulating film which acts to prevent oxygen desorption from the ion-conductive layer without damage on resistance-variable element 25. As protective insulating film 24, for example, SiN film, SiCN film, or the like may be used. Preferably, protective insulating film 24 may be the same material as hard mask film 12 and insulating barrier film 7. If the same material is used, protective insulating film 24 is integral with insulating barrier film 7 and hard mask film 12 to enhance interface adhesion.

(Embodiment 4)

A method for manufacturing the semiconductor device according to Embodiment 3 will be described in this embodiment with reference to the drawings. FIGS. 4-7 are cross-section views showing processes of a method for manufacturing the resistance-variable element of Embodiment 3.

First, interlayer insulating film 2 (for example, silicon oxide film; film thickness 300 nm) is deposited on semiconductor substrate 1 (for example, a substrate on which a semiconductor element is formed). Then, barrier insulating film 3 (for example, SiN film; film thickness 50 nm) is deposited on interlayer insulating film 2. Then, interlayer insulating film 4 (for example, silicon oxide film; film thickness 300 nm) is deposited on barrier insulating film 3. Then, wiring grooves are formed on interlayer insulating film 4, barrier insulating film 3 and interlayer insulating film 2 by a lithography method (including photoresist formation, dry etching, and photoresist removal). Then, first wirings 5a and 5b (for example, Cu) are embedded into said wiring grooves with barrier metals 6a and 6b (for example, TaN/Ta; film thickness 5 nm/5 nm) interposed. Then, insulating barrier film 7 (for example, SiN film; film thickness 50 nm) is formed on interlayer insulating film 4 containing first wirings 5a and 5b. Then, hard mask film (not shown; for example, silicon oxide film) is formed on insulating barrier film 7. Then, an opening is patterned on hard mask film using a photoresist (not shown). The pattern of opening is formed on hard mask film by a dry etching using the photoresist as a mask. Then, the photoresist is removed by a method such as oxygen plasma ashing. Then, an opening is formed on insulating barrier film 7 by etchback of insulating barrier film 7 exposed from the opening of hard mask film using hard mask film as a mask, and first wiring 5 is exposed from on the opening of insulating barrier film 7, wherein the opening is communicated with first wiring 5a. Then, copper oxides formed on the exposed surface of first wiring 5a are removed by organic stripping treatment using a stripping liquid such as amine-based stripping liquid, and simultaneously etching by-products produced during the etchback process are removed (Step B1; see FIG. 4(A)).

In Step B1, the wiring grooves with respect to interlayer insulating film 4 and barrier insulating film 3 have the depth overetched by about 70 nm additionally from the bottom surface of interlayer insulating film 4 plus the film thickness of interlayer insulating film 4. Also, barrier insulating film 3 is perforated, and interlayer insulating film 2 is formed with the depth of about 20 nm from the top surface of the barrier insulating film. Thus, by pre-etching barrier insulating film 3, the wiring grooves may easily be removed.

Further, in Step B1, a reactive dry etching (etchback) for forming an opening in insulating barrier film 7 may be performed under the condition of $CF_4$/Ar=25:50 sccm, 0.53 Pa, Source 400 W, Substrate bias 90 W. By increasing the source power or increasing the substrate bias, etching ionicity may be enhanced and taper angle may be reduced. Also, about 30 nm of the remaining film of insulating bather film 7 on the bottom of opening of insulating barrier film 7 may be etched by about 55 nm (about 80% over).

Further, in Step B1, heat treatment may be performed at 350° C. under reduced pressure using a heat chamber fitted within a sputtering device.

Further, in Step B1, RF etching using a non-reactive gas is performed using Ar gas in a RF etching chamber under the condition of Ar=30 sccm, 1.3 Pa, Source 290 W, Substrate bias 130 W. RF etching time may be quantified based on an etching amount of $SiO_2$ film formed by plasma CVD, and may be set at 3 nm in terms of said $SiO_2$ film.

At the end of Step B1, first wiring 5b was covered with insulating barrier film 7, and first wiring 5b other than opening is RF etched.

Then, a metallic Ti film having the thickness of 2 nm is deposited on insulating barrier film 7 containing first wirings 5a and 5b by DC sputtering. Then, the ion-conductive layer (for example, $Ta_{0.8}Si_{0.2}O_x$; film thickness 13 nm) is deposited on insulating barrier film 7 containing first wirings 5a and 5b by RF (Radio Frequency; high frequency) sputtering. The metallic Ti film is completely oxidized by oxygen plasma during the formation of ion-conductive layer to form titanium oxide film 8. Then, first upper electrode 10 (for example, Ru; film thickness 10 nm) and second upper electrode 11 (for example, Ta; film thickness 50 nm) are formed on the ion-conductive layer in this order (Step B2; see FIG. 4(B)).

In Step B2, RF sputtering of the ion conductive layer may be performed using tantalum oxide ($Ta_{0.8}Si_{0.2}O_x$) containing 20% Si as a target under the condition of RF power 1~3 KW, room temperature, $Ar/O_2$ mixed gas, and 1.3 Pa.

Specifically, the condition of $Ar/O_2$=80/10 sccm, pressure 1.3 Pa, and RF power 3 kW may be used. Under this condition, when observing the thickness of titanium oxide film relative to the thickness of metallic Ti film by TEM cross-section observation, it has been found that the film thickness was varied as follows: Ti 1 nm→titanium oxide 2 nm, Ti 2 nm→titanium oxide 3.1 nm, Ti 3 nm→titanium oxide 4.2 nm. Also, when the thickness of titanium oxide film is 2 nm or 3.1 nm, the switching property having ON/OFF resistance ratio of 6 figures or more was confirmed. On the otherhands, when the thickness is 4.2 nm, the switching property having ON/OFF resistance ratio of 2-3 figures was confirmed, and yield was also lowered. From this result, the thickness of titanium oxide film is preferably 4 nm or less.

Further, depending on the specification of device, when oxidizing power by oxygen plasma is strong, $Ar/O_2$ mixed gas may be changed to pure Ar gas, or alternatively the oxidation state of a valve-metal such as metallic Ti may be properly controlled by lowering the temperature of a substrate below room temperature.

Further, to maintaining the high film-forming rate for ion-conductive layer 9, the condition used in forming the film may be changed to 2 steps condition. In this case, the deposition is performed using pure Ar gas in a first step, and then the deposition is performed using $Ar/O_2$ mixed gas in a second step. Since $Ar/O_2$ mixed gas exhibits fast film-forming rate, the throughput may be effectively improved.

Further, in Step B2, first upper electrode 10 may be deposited by DC (direct current) sputtering using Ru as a target under the condition of DC power 0.2 kW, Ar gas, and 0.27 Pa.

In addition, second upper electrode 11 may also be deposited by DC sputtering using Ta a target under the same condition. Since both of first upper electrodes 10 and 11 are deposited under reduced pressure, the deposition is performed at room temperature to inhibit oxygen desorption from ion-conductive layer 9.

At the end of Step B2, first wiring 5b was covered with insulating barrier film 7, titanium oxide film 8, ion-conductive layer 9, first upper electrode 10 and second upper electrode 11.

Then, hard mask film 12 (for example, SiN film; film thickness 30 nm) and hard mask film 23 (for example, $SiO_2$ film; film thickness 200 nm) are laminated on second upper electrode 11 in this order (Step B3; see FIG. 4(C)).

Herein, hard mask films 12 and 23 may be formed by a plasma CVD method. Hard mask films 12 and 23 may be formed by usual plasma CVD methods known in the art. The film-forming temperature was set to 200° C.

At the end of Step B2, first wiring 5b was covered with insulating barrier film 7, titanium oxide film 8, ion-conductive layer 9, first upper electrode 10, second upper electrode 11, hard mask film 12, and hard mask film 23.

Then, a photoresist (not shown) for patterning the resistance-variable element is formed on hard mask film 23. Then, a dry etching is subjected to hard mask film 23 using the photo-resist as a mask until hard mask film 12 is exposed. Then, the photoresist is removed by oxygen plasma ashing and organic stripping processes. Then, hard mask film 12, second upper electrode 11, first upper electrode 10, and ion-conductive layer 3 is sequentially dry etched using hard mask film 23 as a mask (Step B4; see FIG. 5(A)).

In Step B4, the dry etching of hard mask film 23 is preferably stopped at the top surface or the inside of hard mask film 12. In this case, ion conductive layer 9 is not exposed to oxygen plasma since it is covered with hard mask film 12. Hard mask film 23 may be dry etched using a usual parallel flat-type dry etching device.

In Step B4, each of hard mask film 12, second upper electrode 11, first upper electrode 10, and ion-conductive layer 9 and titanium oxide film 8 may be etched using a parallel flat-type dry etcher. Hare mask film 12 (for example, SiN film) may be etched under the condition of $CF_4/Ar$=25/50 sccm, 0.53 Pa, Source 400 W, Substrate bias 90 W.

Also, second upper electrode 11 (for example, Ta) may be etched under the condition of $Cl_2$=50 sccm, 0.53 Pa, Source 400 W, Substrate bias 60 W.

Also, first upper electrode 10 (for example, Ru) may be etched under the condition of $Cl_2/O_2$=5/40 sccm, 0.53 Pa, Source 900 W, Substrate bias 100 W.

Also, first upper electrode 10 made using Ni may be dry-etched using a parallel flat-type dry etcher under the condition of gas: $CH_3OH$=50 sccm, pressure: 1.3 Pa, source/substrate bias power: 1500/300 W and etching rate: about 50 nm/min.

Also, ion-conductive layer 9 (for example, $Ta_{0.8}Si_{0.2}O_x$) may be etched under the condition $Cl_2/CF_4/Ar$=45/15/15 sccm, 1.3 Pa, Source 800 W, Substrate bias 60 W. By using these conditions, the generation of sub-trench may be inhibited during the procedure. Also, the remaining film of insulating barrier film 7 on first wirings 5a and 5b may be controlled such that the thickness is 40 nm.

Then, protective insulating film 24 (for example, SiN film, 30 nm) is deposited on hard mask film 23, hard mask film 12, second upper electrode 11, first upper electrode 10, ion-conductive layer 9, titanium oxide film 8 and insulating barrier film 7 (Step B5; see FIG. 5(B)).

In Step B5, protective insulating film 24 may be formed by high density plasma using $SiH_4$ and $N_2$ as fuel gases at the substrate temperature of 200° C. Since a reductive gas such as $NH_3$ or $H_2$ is not used, the reduction of ion conductive layer 9 (for example, $Ta_{0.8}Si_{0.2}O_x$) may be inhibited during a film-forming gas stabilizing process just before the film is formed. Insulating barrier film 7, protective insulating film 24 and hard mask film 12 over first wiring 5 are SiN films formed using the same material. Therefore, the peripheral portion of the resistance-variable element is integrally formed and protected to improve interface adhesion. As a result, water-absorbing property, water-proofing property, tolerance to oxygen desorption tolerance may be improved, thereby improving the yield and reliability of the element.

Then, interlayer insulating film 15 (for example, silicon oxide film; film thickness 500 nm) is deposited on protective insulating film 24 by plasma CVD (Step B6; see FIG. 5(C)).

Then, interlayer insulating film 15 is flattened by CMP (Step B7; see FIG. 6(A)).

In flattening, interlayer insulating film 15 may be shaved by about 350 nm from the top surface of interlayer insulating film such that the thickness of the remaining film is about 150 nm. Interlayer insulating film 15 may be polished using colloidal silica or seria-based slurry which is usually used in CMP. According to Example 2, by flattening interlayer insulating film 15, hard mask film 23 is exposed, and hard mask film 23 and protective insulating film 24 are also flattened.

Then, etching stopper film 16 (for example, SiN film; film thickness 50 nm) and interlayer insulating film 17 (for example, silicon oxide film; film thickness 300 nm) are deposited on interlayer insulating film 15 containing hard mask film 23 and protective insulating film 24 in this order (Step B8; see FIG. 6(B)).

In Step B8, etching stopper film 16 and interlayer insulating film 17 may be deposited by plasma CVD.

Then, second wiring (members 18a and 18b of FIG. 3) and plug (members 19a and 19b of FIG. 3) are formed by Via-First method of a dual Damascene method.

In the Via-First method, first, a photoresist (not shown) for pre-forming holes 71a and 71b for plug (members 19a and 19b of FIG. 3) is formed on interlayer insulating film 17. Then, pre-formed hole 71a for plug (member 19a of FIG. 3) is formed in interlayer insulating film 17, etching stopper film 16 and hard mask film 23 by a dry etching using said photoresist as a mask, and simultaneously pre-formed hole 71b for plug (member 19b of FIG. 3) is formed in interlayer insulating film 17, etching stopper film 16 and hard mask film 15. Then, the photoresist is removed by oxygen plasma ashing and organic stripping processes (Step B9; see FIG. 9(A)).

In Step B9, an etching condition and time may be controlled such that the dry etching is stopped at hard mask film 12 on the bottom of pre-formed hole 71a and protective insulating film 24 on the bottom of pre-formed hole 71b. In this case, since the dry etching is stopped at hard mask film 12 on the bottom of pre-formed holes 71a and 71b, the top surface or the inside of protective insulating film 24, each of holes 71a and 72b may be patterned using separate reticles, respectively, and then may be formed under a different etching condition.

Then, a photoresist (not shown) for pre-forming wiring grooves 72a and 72b for second wiring (members 18a and 18b of FIG. 3) is formed on interlayer insulating film 17. Then, wiring grooves 72a and 72b for second wiring (members 18a and 18b of FIG. 3) are formed on inter-layer insulating film 17 and etching stopper film 16 by a dry etching using said photoresist as a mask. Then, the photoresist is removed by oxygen plasma ashing and organic stripping processes (Step B10; see FIG. 9(B)).

In Step B10, the bottoms of pre-formed holes 71a and 71b may be prevented from being perforated by embedding a material such as ARC (Anti-Reflection Coating; anti-reflective film) into the bottoms of pre-formed holes 71a and 71b.

Further, in Step B10, since the bottoms of pre-formed holes 71a and 71b is protected with hard mask film 12, oxidation damage by oxygen plasma ashing may be prevented.

Then, hard mask film 12 on the bottom of pre-formed hole 71a is etched, and simultaneously protective insulating film 24 and insulating barrier film 7 on the bottom of pre-formed hole 71b to expose second upper electrode 11 and first wiring 5b through pre-formed holes 71a and 71b, respectively. Then, barrier metals 20a and 20b (for example, Ta; film thickness 5 nm) are interposed into wiring grooves 72a and 72b, and pre-formed holes 71a and 71b, and second wirings 18a and 18b (for example, Cu), and plugs 19a and 19b (for example, Cu) are concurrently formed. Then, insulating barrier film 21 (for example, SiN film) is deposited on interlayer insulating film 17 containing second wirings 18a and 18b (Step B11; see FIG. 3).

In Step B11, second wirings 18a and 18b may be formed by the same process as in forming the lower wirings. Herein, the diameter of the bottom of plug 19a is preferably less than the diameter of opening of insulating barrier film 7. According to this embodiment, for example, the diameter of the bottom of plug 19a was 240 nm, and the diameter of opening of insulating barrier film 7 was 400 nm. Also, the width of first wiring 5a which also serves as the lower electrode of resistance-variable element 25 is preferably greater than the diameter of opening of insulating barrier film 7. Further, barrier metal 20a and second upper electrode 11 may be formed using the same material to reduce contact resistance between plug 19 and second upper electrode 11, thereby improving the performance of the element (reduction in the resistance of resistance-variable element 25 at ON-state).

(Embodiment 5)

As described above, oxides primarily containing Ta may be formed using an atomic layer deposition method (ALD method), in addition to a sputtering method. For example, a method of forming a $Ta_2O_5$ film will be described below.

First, a $Ta_2O_5$ film is grown in a fluoro-type reactor at 325° C. For example, a raw material may be formed by adding an oxidizing agent to tantalum pentachloride ($TaCl_5$) and tantalum pentaethoxide ($Ta(OC_2H_5)_5$). $TaCl_5$ and $Ta(OC_2H_5)_5$ are vaporized by heating to 90° C. and 105° C., respectively, in the reactor. The $Ta_2O_5$ film is grown by pulsing alternately $TaCl_5$ and $Ta(OC_2H_5)_5$. The duration of pulse may be 0.5 s ($TaCl_5$) and 1.0 s ($Ta(OC_2H_5)_5$), for example.

Then, a washing is performed for 0.2 s and 1.0 s, respectively. The deposition temperature is 275~325° C.

For example, the film is grown at the rates of 0.015 nm/cycle (275° C.) and 0.06 nm/cycle (325° C.). The desired film thickness may be obtained by repeating the cycle. As suitable oxidizing agents, oxygen, ozone, nitrogen dioxide, nitrogen oxide, water vapor, hydrogen peroxide, formic acid, acetic acid, anhydrous acetic acid, and the like may be used. The use of oxidizing agent may promote reactions.

Example 1

Figure 8:
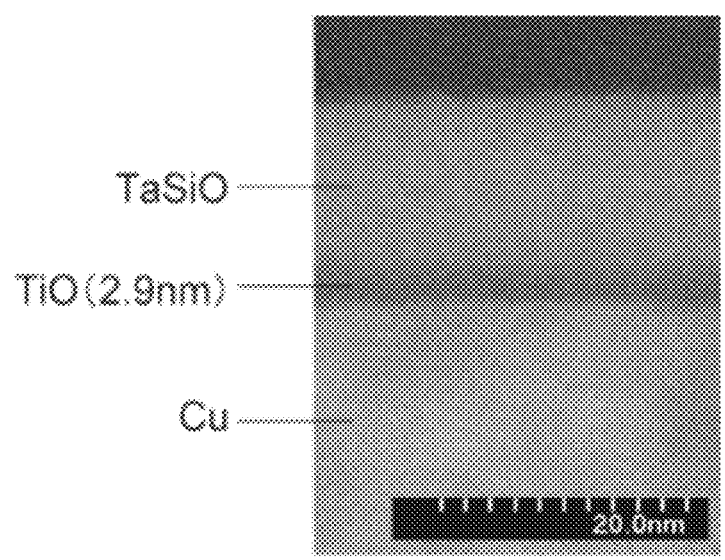
FIG. 8 is a view illustrating TEM cross-section observation of the resistance-variable element performed in Example 1.

The result from TEM observation of the cross-section of resistance-variable element formed according to the method of Embodiment 4 is shown in FIG. 8. It was demonstrated that the titanium oxide film and the ion-conductive layer were laminated directly on the top surface of copper.

Figure 9:
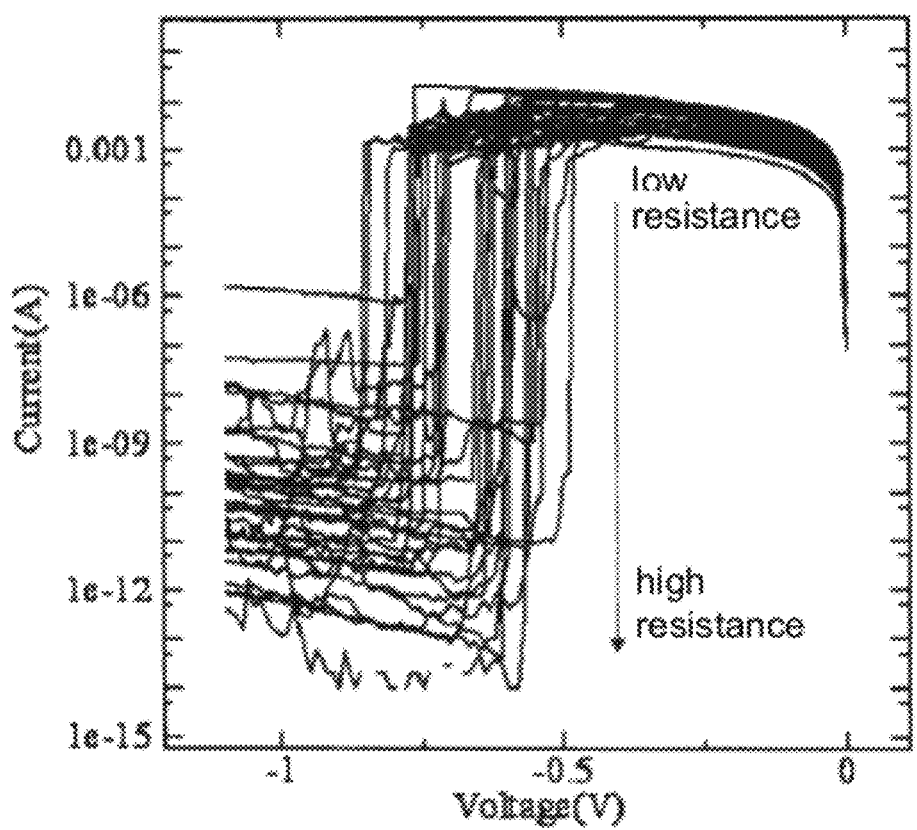
FIG. 9 is a view illustrating I-V property where positive voltage is applied to upper electrode 10 in Example 1.
Figure 10:
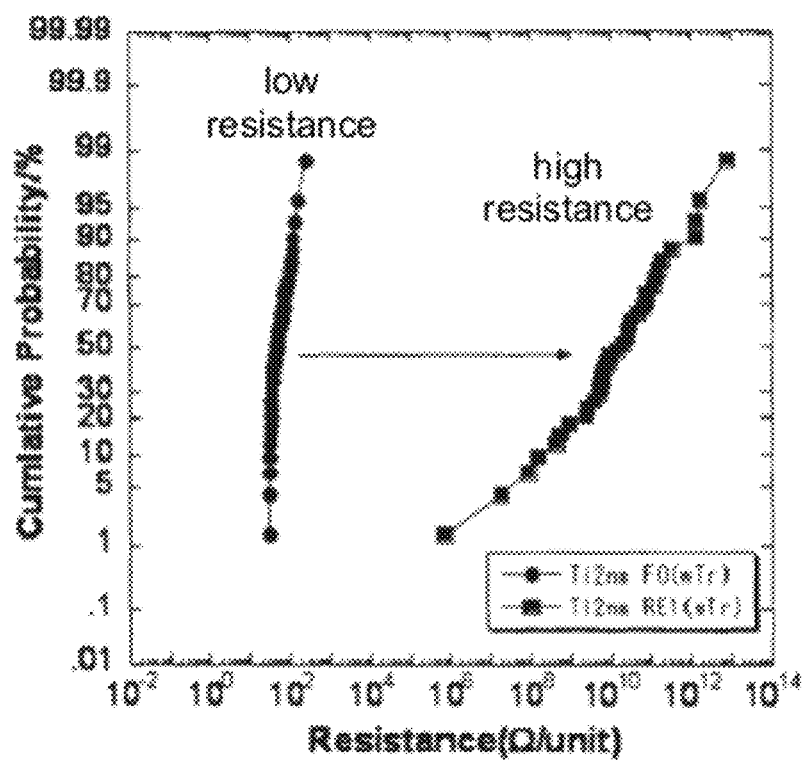
FIG. 10 is a view illustrating the normal distribution of resistance values in low (OFF state) and high (ON state) resistance states for the resistance-variable element formed on a wafer in Example 1.

To upper electrode 10 of resistance-variable element thus formed, the voltage of −5 V was applied to cause foaming, and its resistance was lowered to 100Ω (lowering of resistance). Likewise, I-V property where constant voltage is applied to upper electrode 10 is shown in FIG. 9. It was demonstrated that when the voltage of 0.5 V was applied, the resistance was changed from low resistance (~100Ω) to high resistance (1 GΩ). The normal distribution of resistance values in low (OFF state) and high (ON state) resistance states for the resistance-variable element formed on an 8-inch wafer is shown in FIG. 10. It could be demonstrated that sufficient high ON/OFF resistance ratio was obtained.

To achieve ON/OFF resistance ratio of $10^6$ or higher, the thickness of titanium oxide film is preferably 4 nm or less. Also, the thickness of titanium oxide film may be made as thin as possible as long as the oxidation of wiring can be inhibited.

The present invention has been described with reference to preferred embodiments or examples. However, these embodiments and examples only intend to illustrate the present invention, but the present invention is not limited to these embodiments and examples.

For example, the technologies of semiconductor manufacturing device having a CMOS circuit as an application field constructing the background of the invention achieved by the inventors of the present application were described in detail, and the example where resistance-variable element is formed on the top of copper wiring on the semiconductor substrate was described. However, the present invention is not limited to these examples described herein, and also may be applied to copper wirings used in, for example, semiconductor products having a memory circuit such as DRAM (Dynamic Random Access Memory), SRAM (Static Random Access Memory), flash memory, FRAM (Ferro Electric Random Access Memory), MRAM (Magnetic Random Access Memory), variable resistance memory, bipolar transistor, and the like; semiconductor products having a logic circuit such as microprocessor; or boards or packages provided with both of memory and logic circuits. Further, the present invention may be used for bonding elements such as electronic circuit elements, optical circuit elements, quantum circuit elements, micromachines, or MEMS (Micro Electro Mechanical Systems) to a semiconductor device. Although embodiments realizing a switching function were often described herein, the present invention may be used for a memory element utilizing both of non-volatility and resistance-variable property.

Also, the boding method of substrate using the present invention may be confirmed from the finished state. Specifically, the lower electrode comprising Cu, the titanium oxide film, the ion-conductive layer, and the upper electrode were confirmed by observing the cross-section of a device by TEM (Transmission Electron Microscope). In addition, the multilayer wiring using the copper wiring was confirmed. Furthermore, when a resistance-variable element is provided, the bottom surface of the resistance-variable element is the copper wiring, and the copper wiring also serves as the lower electrode, as well as the presence of titanium oxide film and ion-conductive layer were confirmed. Further, in addition to TEM, materials used may be confirmed by composition analysis by a method such as EDX (Energy Dispersive X-ray Spectroscopy) or EELS (Electron Energy-Loss Spectroscopy). In addition, by such composition analysis, it may be confirmed whether an insulating barrier film on the copper wiring is the same material as a protective film of the resistance-variable element or not.

The present application claims the priority o based on Japanese Patent Application No. 2009-150778 filed on Jun. 25, 2009, and all of the disclosure of which is hereby incorporated.

The present invention has been described with reference to the exemplary embodiments, but the present invention is not limited thereto. A variety of changes that can be understood by those skilled in the art can be made to the configurations and details of the present invention within the scope thereof.

THE DESCRIPTION OF NUMERICAL REFERENCES 101 lower electrode
102a titanium film
102b titanium oxide film
103 ion-conductive layer
104 upper electrode
1 semiconductor substrate
2 interlayer insulating film
3 barrier insulating film
4 interlayer insulating film
5, 5a, 5b first wiring (wiring, lower electrode)
5c TaN/Ru laminated lower electrode (second lower electrode)
6, 6a, 6b barrier metal
7 insulating barrier film
8 titanium oxide film
9 ion-conductive layer
10 first upper electrode
11 second upper electrode
12 hard mask film
13, 23, 28 hard mask film (second hard mask film)
14, 14', 24, 29 protective insulating film
15 interlayer insulating film
16 etching stopper film
17 interlayer insulating film
18, 18a, 18b second wiring
19, 19a, 19b plug
20, 20a, 20b barrier metal
21 barrier insulating film
22, 22', 25, 26, 30, 31 resistance-variable element
32, 34 interlayer insulating film
33 etching stopper film
35 copper wiring
36 barrier metal
37 barrier insulating film
38, 40 interlayer insulating film
39 etching stopper film
41 copper wiring
42 barrier metal
43 barrier insulating film
44, 46 interlayer insulating film
45 etching stopper film
47 copper wiring
48 barrier metal
49 barrier insulating film
50, 52 interlayer insulating film
51 etching stopper film
53 copper wiring
54 barrier metal
55 barrier insulating film
56, 58 interlayer insulating film
57 etching stopper film
59 copper wiring
60 barrier metal
61 barrier insulating film
62 silicon oxide film
63 silicon oxy-nitride film
64 AlCu wiring
65, 66 Ti/TiN film
67 tungsten plug
68 TiN film
70 selective transistor
71a, 71b via hole
72a, 72b groove

What is claimed is:

1. A method for manufacturing a resistance-variable element comprising the steps of:
    forming a first electrode comprising copper;
    forming a valve-metal film on the first electrode;
    forming an ion-conductive layer on the valve-metal film with a gas containing oxygen, wherein the valve-metal film is oxidized to become an oxide film of valve-metal during the step of forming the ion-conductive layer; and
    after the step of forming the ion-conductive layer on the valve-metal film wherein the valve-metal film is oxidized to become the oxide film of valve-metal, forming a second electrode on the ion-conductive layer.

2. The method for manufacturing the resistance-variable element according to claim 1, wherein the ion-conductive layer is formed by a sputtering or ALD method.

3. The method for manufacturing the resistance-variable element according to claim 2, wherein the valve-metal film is a titanium film, and the film has a thickness is 2 nm or less.

4. The method for manufacturing the resistance-variable element according to claim 1, wherein the valve-metal film is one of a titanium film and an aluminum film.

5. The method for manufacturing the resistance-variable element according to claim 1, wherein a thickness of the oxide film is within a range of 1 nm to 3 nm.

6. The method for manufacturing the resistance-variable element according to claim 4, wherein the valve-metal film is the titanium film.

* * * * *